US011215880B2

(12) United States Patent
Sun et al.

(10) Patent No.: US 11,215,880 B2
(45) Date of Patent: Jan. 4, 2022

(54) DISPLAY COMPONENT AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Shumeng Sun, Beijing (CN); Hanyan Sun, Beijing (CN); Minghui Zhang, Beijing (CN); Inho Park, Beijing (CN); Weitao Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 497 days.

(21) Appl. No.: 16/303,353

(22) PCT Filed: May 24, 2018

(86) PCT No.: PCT/CN2018/088184
§ 371 (c)(1),
(2) Date: Nov. 20, 2018

(87) PCT Pub. No.: WO2019/037495
PCT Pub. Date: Feb. 28, 2019

(65) Prior Publication Data
US 2021/0223636 A1 Jul. 22, 2021

(30) Foreign Application Priority Data
Aug. 24, 2017 (CN) .......................... 201710738926.4

(51) Int. Cl.
*G02F 1/1343* (2006.01)
*G02F 1/13* (2006.01)
*G02F 1/1335* (2006.01)

(52) U.S. Cl.
CPC ...... *G02F 1/134309* (2013.01); *G02F 1/1323* (2013.01); *G02F 1/133512* (2013.01); *G02F 2202/36* (2013.01); *G02F 2203/10* (2013.01)

(58) Field of Classification Search
CPC .............. G02F 1/1323; G02F 2203/10; G02F 2202/36; H01L 27/3232; H01L 27/3209
See application file for complete search history.

(56) References Cited

U.S. PATENT DOCUMENTS

2003/0214479 A1   11/2003   Matsuda et al.
2007/0153168 A1   7/2007    Lim
(Continued)

FOREIGN PATENT DOCUMENTS

CN   101968566 A   2/2011
CN   103728769 A   4/2014
(Continued)

OTHER PUBLICATIONS

International Search Report dated Aug. 27, 2018, issued in counterpart Application No. PCT/CN2018/088184 (10 pages).
(Continued)

*Primary Examiner* — Jessica M Merlin
(74) *Attorney, Agent, or Firm* — Westerman, Hattori, Daniels & Adrian, LLP

(57) ABSTRACT

The present disclosure is related to a display component. The display component may include a display module and a viewing angle switch module at a light-exiting side of the display module. The display module may include a plurality of columns of light-emitting pixels on a base substrate. Each of the light-emitting pixels may include a first electrode layer, a nanoparticle layer, and a transparent second electrode layer in this order on the base substrate. The nanoparticle layer may include nanoparticles of a first metal, each of the nanoparticles of the first metal having a convex protru-
(Continued)

sion on a side away from the first electrode layer. The transparent second electrode layer may include a nanoparticle of a second metal.

15 Claims, 8 Drawing Sheets

(56) References Cited

U.S. PATENT DOCUMENTS

| 2012/0099047 A1* | 4/2012 | Lee ..................... G02F 1/1323 349/62 |
|---|---|---|
| 2012/0200817 A1 | 8/2012 | Tweet et al. |
| 2014/0104878 A1 | 4/2014 | Chen et al. |
| 2017/0271606 A1 | 9/2017 | Choi et al. |

FOREIGN PATENT DOCUMENTS

| CN | 104656249 A | | 5/2015 |
| CN | 105911746 A | | 8/2016 |
| CN | 106450016 A | | 2/2017 |
| CN | 106773180 A | | 5/2017 |
| CN | 106873234 A | * | 6/2017 |
| CN | 106873234 A | | 6/2017 |
| KR | 10-2011-0003080 A | | 1/2011 |

OTHER PUBLICATIONS

Office Action date Dec. 26, 2019, issued in counterpart Application No. 201710738926.4, with English translation (15 pages).
Extended (Supplementary) European Search Report dated May 4, 2021, issued in counterpart EP application No. 18803305.4. (12 pages).

* cited by examiner

DISPLAY COMPONENT AND DISPLAY APPARATUS

CROSS-REFERENCE TO RELATED APPLICATIONS

This application claims benefit of the filing date of Chinese Patent Application No. 201710738926.4 filed on Aug. 24, 2017, the disclosure of which is hereby incorporated by reference.

TECHNICAL FIELD

The present invention relates to display technology and, more particularly, to a display component and a display apparatus.

BACKGROUND

Dual view display mode refers to display of different images in different angles. That is, a user can view different images on a display screen from different angles. Compared to traditional display modes, dual view display mode increases utilization of the display screen, allowing a display screen to display two kinds of information at the same time. Currently, there has been great interest in dual-view display mode especially for applications such as cars and advertising screens.

BRIEF SUMMARY

Accordingly, one example of the present disclosure is a display component. The display component may include a display module and a viewing angle switch module at a light-exiting side of the display module. The display module may include a plurality of columns of light-emitting pixels on a base substrate. Each of the light-emitting pixels may include a first electrode layer, a nanoparticle layer, and a second electrode layer. The nanoparticle layer may include nanoparticles of a first metal. Each of the nanoparticles of the first metal may have a convex protrusion on a side away from the first electrode layer. The second electrode layer may include a nanoparticle of a second metal. The first metal may be gold. The second metal may be silver. The convex protrusion of nanoparticles of the first metal may be a cone shape or a truncated cone shape.

Every two adjacent columns of the light-emitting pixels may constitute a pixel unit, and the display module may further include a black matrix between adjacent pixel units. Each of the columns of the light-emitting pixels may have N rows, and N is an integer greater than or equal to 1. In one embodiment, N is an integer less than or equal to 5.

The viewing angle switch module may include a plurality of viewing angle control unit. Each of the plurality of viewing angle control units may include two viewing angle control sections extending in a column direction. Each of the viewing angle control sections may correspond to a column of the light-emitting pixels.

Each of the viewing angle control sections may include an insulating layer covering the display module, a third electrode layer, a fourth electrode layer, and a blocking portion between the third electrode layer and the fourth electrode layer. An accommodating chamber may be formed between adjacent blocking portions, and a black non-polar liquid may be accommodated in the accommodating chamber. The accommodating chamber may correspond to one column of the light-emitting pixels. The black non-polar liquid may be configured to cover the accommodating chamber in a presence of an electric field between the third electrode layer and the fourth electrode layer and collect in a region where the accommodating chamber and the black matrix overlap in an absence of an electric field between the third electrode layer and the fourth electrode layer.

The nanoparticle layer may further include a partition wall configured to separate the adjacent nanoparticles of the first metal, and the partition wall may include an insulating material. The insulating material may be silicon dioxide. The first electrode layer of each of the light-emitting pixels may be connected to one another to form a unitary structure or the second electrode layer of each of the light-emitting pixels may be connected to one another to form a unitary structure. The third electrode layer of each of the plurality of viewing angle control sections may be connected one another to form a unitary structure or the fourth electrode layer of each of the viewing angle control sections may be connected one another to form a unitary structure.

Each of the viewing angle control sections may be configured to transmit light emitted by the corresponding column of the light-emitting pixels in a first display mode, and to block the light emitted by the corresponding column of the light emitting pixels and exiting on a side from a peak of the convex protrusion of nanoparticles of the first metal away from the other column of the light emitting pixels in the same pixel unit in a second display mode.

Another example of the present disclosure is a display apparatus. The display apparatus may include the display component according to one embodiment of the present disclosure.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

Figure 1:
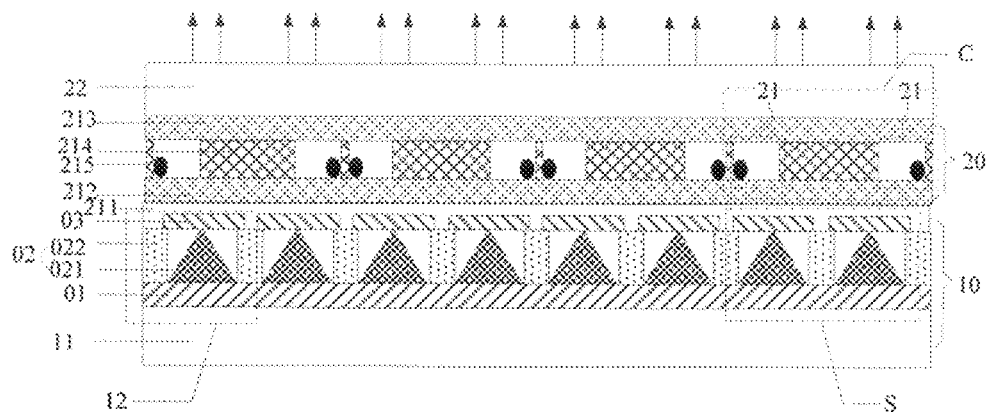
FIG. 1 is a schematic cross-sectional view of a display component according to one embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-9. When referring to the figures, like structures and elements shown throughout are indicated with like reference numerals. The described embodiments are merely some but not all of the embodiments of the present invention. All other embodiments obtained by persons of ordinary skill in the art based on the embodiments of the present disclosure without creative effort shall fall within the protection scope of the present invention. Shapes and sizes of the display components in the drawings do not reflect the true scale, and are only intended to illustrate the present disclosure.

In this specification, the terms "first," "second," "third," and "fourth" may be added as prefixes. These prefixes, however, are only added in order to distinguish the terms and do not have specific meaning such as order and relative merits.

"Metallic nanomaterials" are materials composed of a structure having at least one dimension within a three-dimensional space in a nanometer scale range (1 to 100 nm) or materials composed of the nanostructure as basic units. The nano-dimensional features of the metallic nanomaterials make them different from both microscopic atoms and traditional bulk metal and crystalline materials. The metallic nanomaterials possess special physical and chemical properties due to surface effect, small size effect, quantum size effect and macroscopic quantum tunneling effect.

When an incident light is irradiated onto a metal nanoparticle whose size is much smaller than a wavelength of light, if the frequency of the incident photon is equal or comparable to an oscillation frequency of an electron on the surface of the metal nanoparticle, the electron and the incident photon strongly resonate on a local surface area of the metal nanoparticle. This phenomenon is termed Local Surface Plasmon Resonance effect (LSPR). When the LSPR occurs on the surface of metal nanoparticles, the metal nanoparticles strongly absorb energy of the incident photons having the same or comparable oscillation frequency of the electrons or radiate electromagnetic wave having the same or comparable oscillation frequency of the electrons. That is, these properties are termed LSPR absorption or LSPR scattering, respectively.

However, the LSPR properties of metal nanoparticles are closely related to their elemental composition. A display component according to one embodiment of the present disclosure precisely composes elemental composition of the metal nanoparticles by electrodeposition and/or electroerosion so as to adjust LSPR properties of the metal nanoparticles, and accordingly continuously adjusts absorption and scattering of visible light by the metal nanoparticles. As such, a color display having no polarization and no color film can be realized.

As shown in FIG. 1 to FIG. 5 of the present application, one example of the present disclosure is a display component. The display component comprises a display module 10 and a viewing angle switching module 20 located at a light-existing side of the display module 10.

Figure 2:
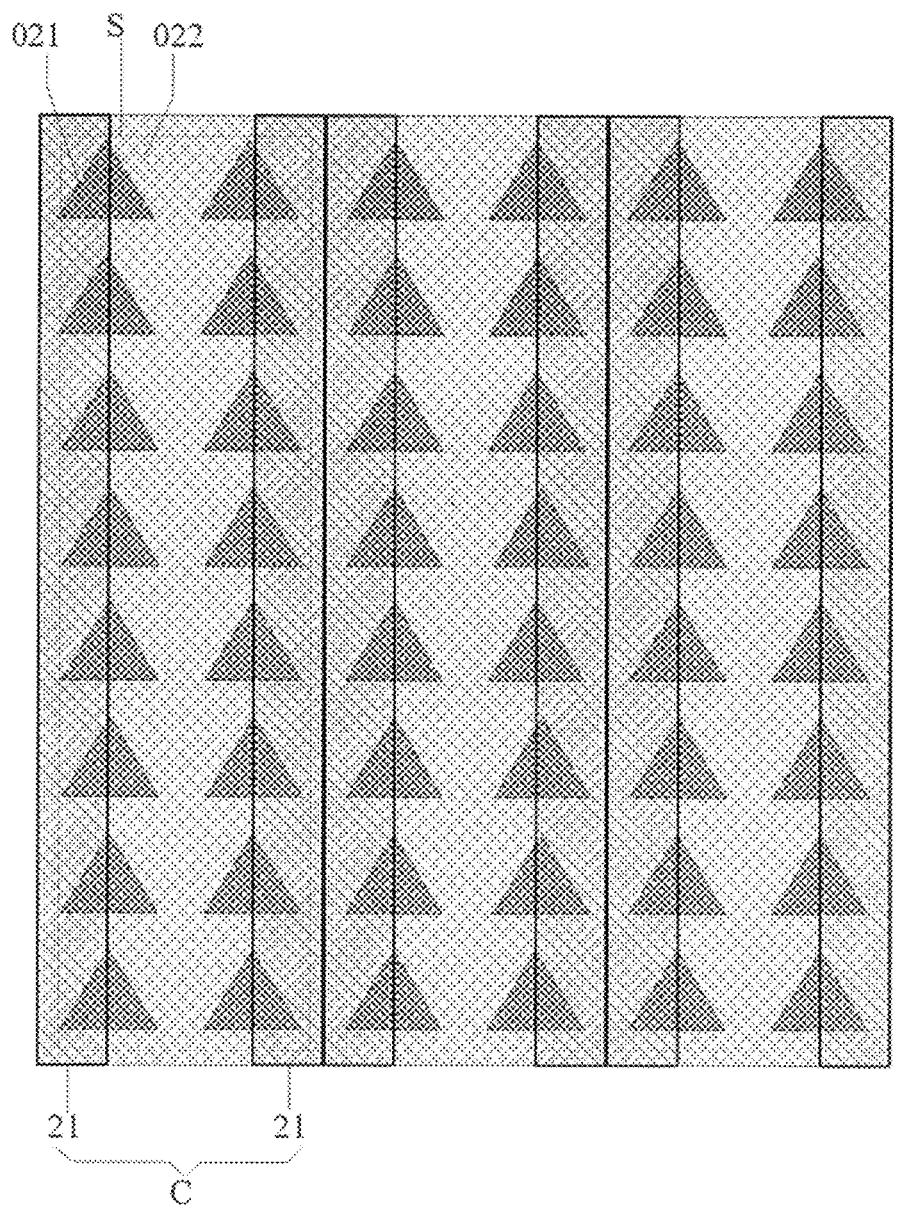
FIG. 2 is a schematic top view of structure of a display component according to one embodiment of the present disclosure.

FIG. 1 is a schematic cross-sectional view of a display component according to one embodiment of the present disclosure. FIG. 2 is a schematic top view of structure of a display component according to one embodiment of the present disclosure.

In one embodiment, as shown in FIG. 1, the display module 10 comprise: a base substrate 11 and a plurality of light-emitting pixels 12 arranged in a matrix on the base substrate 11. The light-emitting pixel 12 includes a first electrode layer 01, a nanoparticle layer 02, and a second transparent electrode layer 03 sequentially disposed on the base substrate 11. The nanoparticle layer 02 contains nanoparticles of a first metal 021. The nanoparticle of the first metal 021 has a convex protrusion on a side away from the first electrode layer 01. The second electrode layer 03 contains an ion of a second metal. In one embodiment, the second electrode layer 03 contains a nanoparticle of a second metal.

As shown in FIG. 1 and FIG. 2, every two adjacent columns of light-emitting pixels 12 constitute a pixel group S. The viewing angle switch module 20 includes a plurality of viewing angle control units C, each of the viewing angel control units corresponding to one of the pixel groups S. In one embodiment, the viewing angle control unit C includes two viewing angle control sections 21 extending in a column direction. A viewing angle control section 21 corresponds to one column of light-emitting pixels 12. As shown in FIG. 1 and FIG. 2, in a first display mode, the viewing angle control section 21 is configured to transmit light emitted by the corresponding column of light emitting pixels 12.

Figure 3:
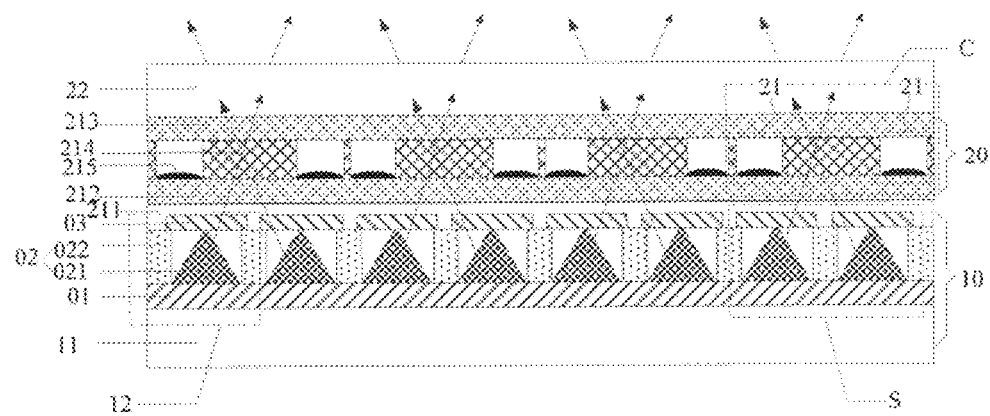
FIG. 3 is a schematic cross-sectional view of a display component according to one embodiment of the present disclosure.
Figure 4:
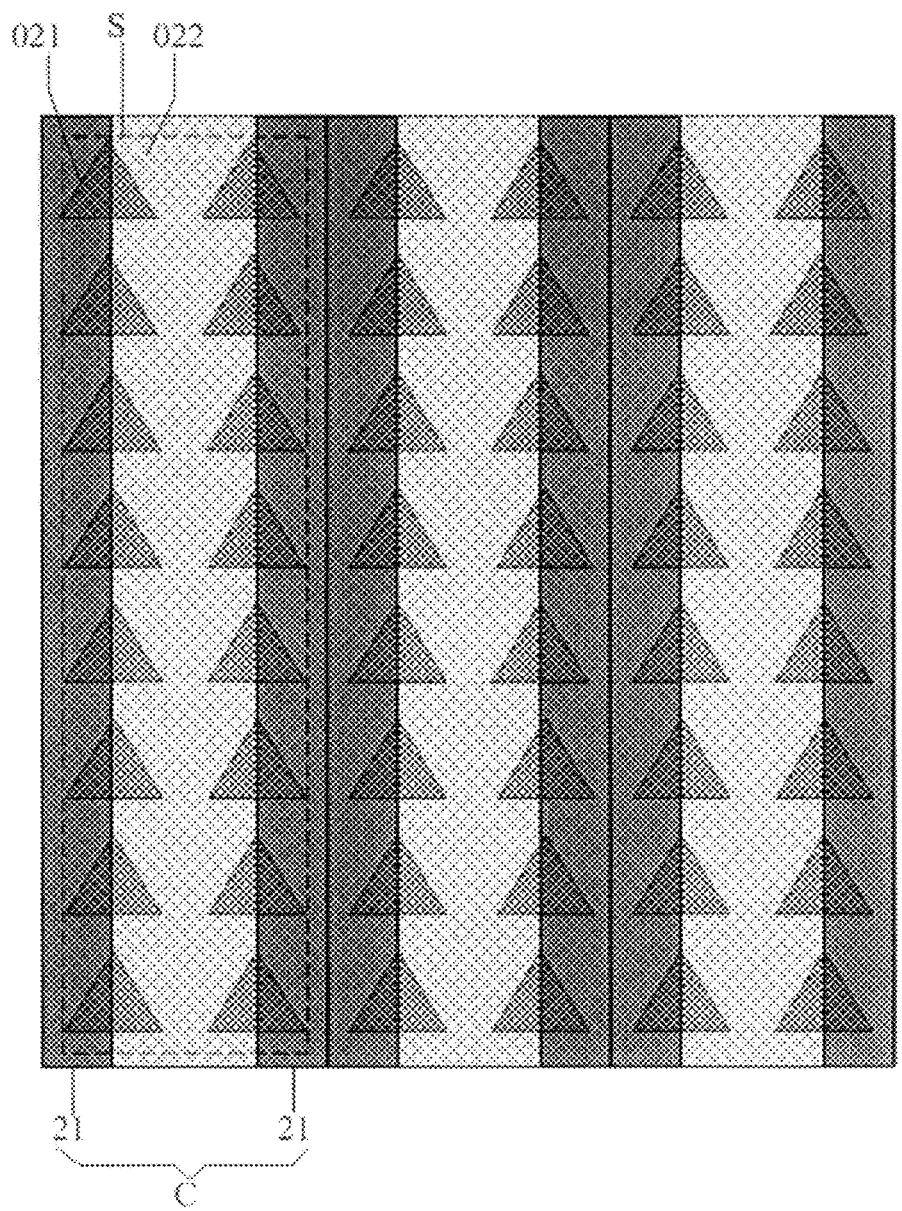
FIG. 4 is a schematic top view of structure of a display component according to one embodiment of the present disclosure.
Figure 5:
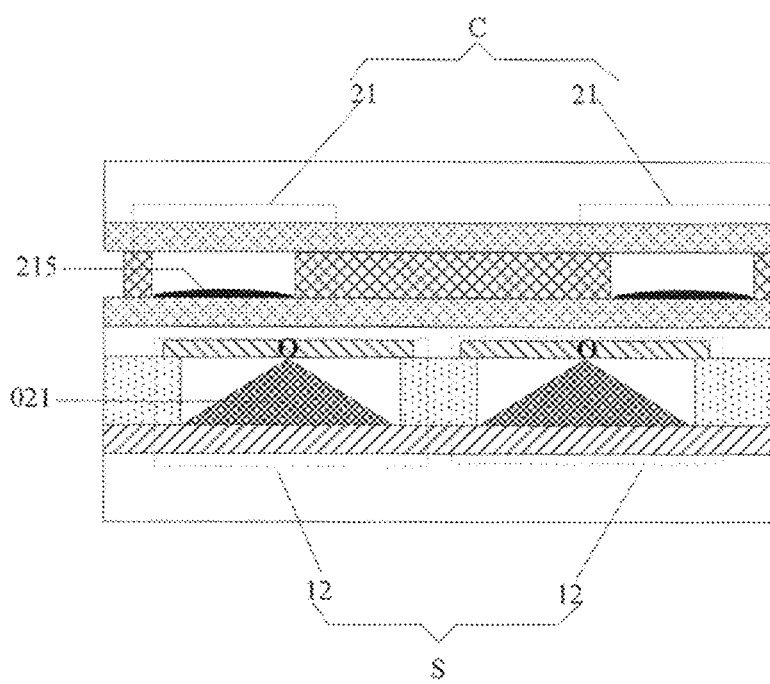
FIG. 5 is a partial enlarged view of a display component according to one embodiment of the present disclosure.

FIG. 3 is a schematic cross-sectional view of a display component according to one embodiment of the present disclosure. FIG. 4 is a schematic top view of structure of a display component according to one embodiment of the present disclosure. FIG. 5 is a partial enlarged view of a display component according to an embodiment of the present invention.

As shown in FIG. 3 to FIG. 5, in a second display mode, the viewing angle control section 21 is configured to block light emitted by the corresponding column of light emitting pixels and exiting on a side from the peak of the convex protrusion of the nanoparticles of the first metal 021 away from the other column of the light emitting pixels in the same pixel group S. For example, as shown in FIG. 5, the viewing angle control section 21 on the left side blocks the light of the left light emitting pixel 12 exiting from the left side of the peak O of the convex protrusion. The viewing angle control section 21 on the right side blocks the light of the right light emitting pixel 12 exiting from the right side of the peak O of the convex protrusion.

In the display component according to one embodiment of the present disclosure, because the nanoparticles of the first metal in the display module have the convex protrusion on the side away from the first electrode layer, the light can be emitted from different angles. By adjusting blocking state of the viewing angle control section in the viewing angle switch module, a dual view display mode as well as a traditional display mode can be realized. Furthermore, since the nanoparticles of the first metal are at nanoscale, their particle sizes are so small, and accordingly ultra-high resolution display can be achieved.

In the display component provided by one embodiment of the present disclosure, without being held to a particular theory, it is believed that the display principle of the display module may be as follows: when electricity is applied between the first electrode layer, the nanoparticle layer, and the second electrode layer, ions of the second metal are reduced to the second metal, and the second metal is then deposited onto surface of nanoparticles of the first metal to form composite metal nanoparticles. In another embodiment, the second metal on the surface of nanoparticles of the first metal is oxidized to ions of the second metal, and the ions of the second metal are formed on the second electrode layer. That is, the elemental composition of the composite metal nanoparticles is controlled by electrodeposition (second metal reduction) and electroerosion (the second metal is oxidized) to adjust the LSPR properties of the composite metal nanoparticles so as to continuously adjust absorption and scattering of the visible light by the composite metal nanoparticles to realize a color display with fast response, no polarization, and no color film.

Furthermore, in the display component according to one embodiment of the present disclosure, when a static image is displayed, since there is no requirement of constant flipping of liquid crystals as in a liquid crystal display component, power consumption is relatively low.

In the display component provided by one embodiment of the present disclosure, the first display mode refers to a traditional display mode, that is, the same display image can be viewed regardless of whether a person is at any side of the display component. The second display mode refers to a dual view display mode, that is, a person who is on the left side of the display component and a person on the right side of the display component can view different display images.

In the display component provided by one embodiment of the present disclosure, as shown in FIG. 1 and FIG. 3, the nanoparticle layer 02 includes nanoparticles 021 a first metal, and a partition wall 022 for separating adjacent nanoparticles 021 of the first metal. The wall 022 may be made of an insulating material so as to ensure independence between the nanoparticles 021 of the first metal while maintaining stable properties and also allowing an efficient electrochemical reaction between the first metal and the second metal.

In one embodiment, the partition wall can be formed by forming passing holes in a film layer, and a nanoparticle of a first metal is placed in each of the passing holes. In one embodiment, the partition wall is made of silicon dioxide. Of course, the partition wall can also be made of other insulating material and not limited thereto.

Figure 6:
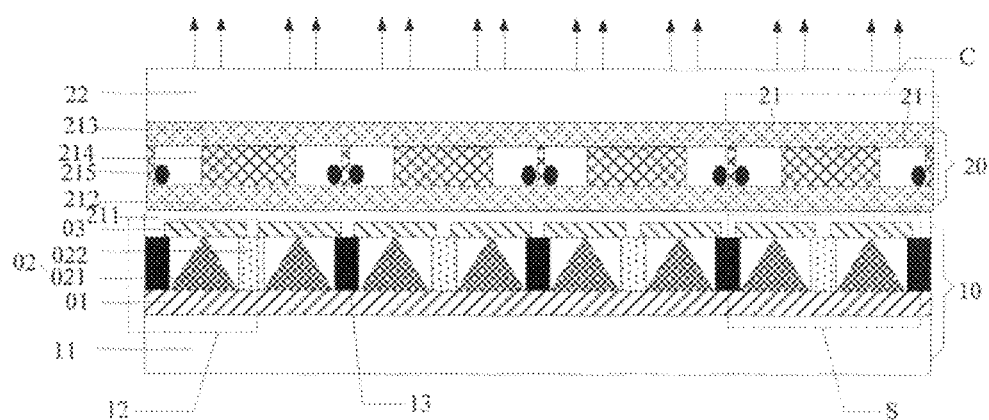
FIG. 6 is a schematic cross-sectional view of a display component according to one embodiment of the present disclosure.
Figure 7:
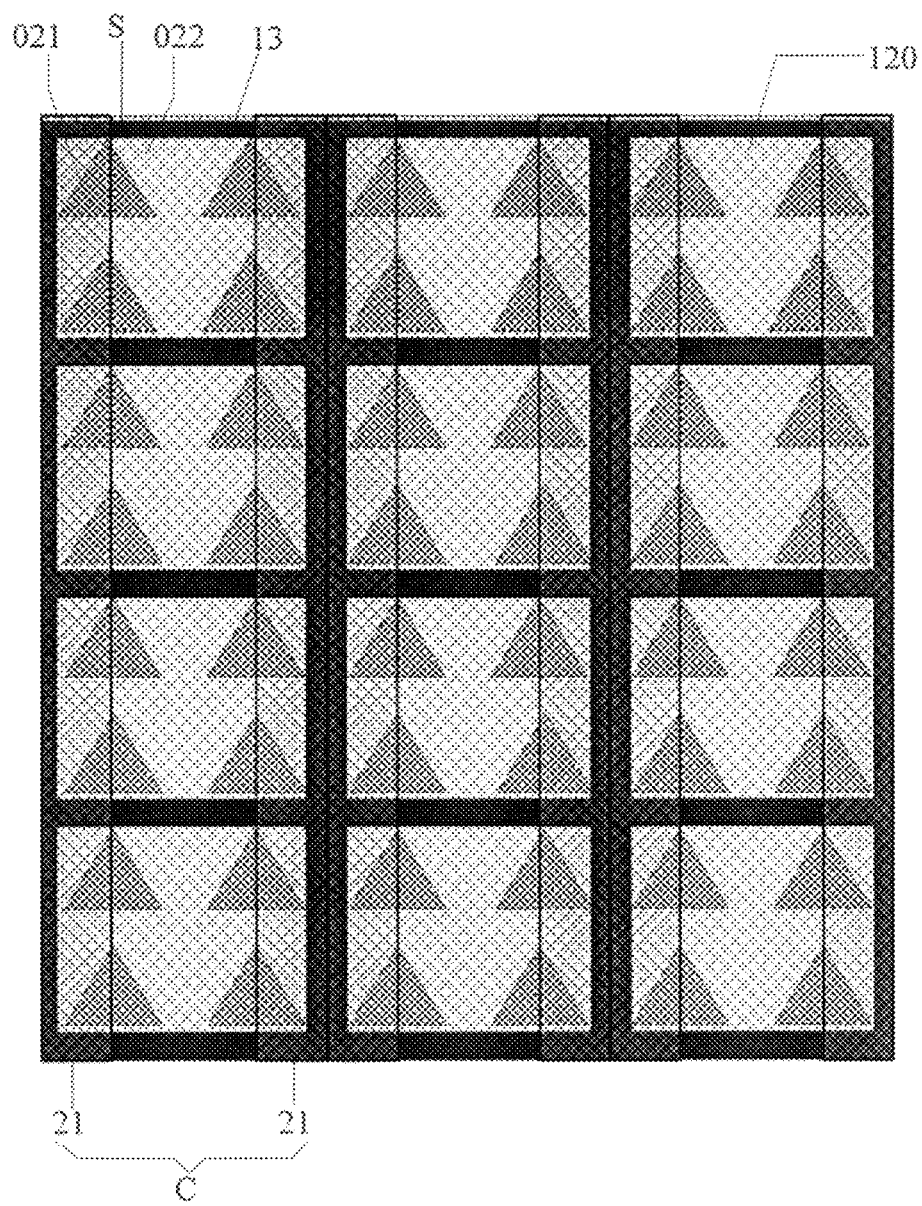
FIG. 7 is a schematic top view of a display component according to one embodiment of the present disclosure.

FIG. 6 is a schematic cross-sectional view of a display component according to one embodiment of the present disclosure. FIG. 7 is a schematic top view of structure of a display component according to one embodiment of the present disclosure.

In one embodiment, in order to prevent color mixing, in the display component provided by one embodiment of the present disclosure, as shown in FIG. 6 and FIG. 7, the display module 10 includes two columns of N rows of pixels 12 as one pixel unit 120, and the display module 10 further includes a black matrix 13 located between adjacent pixel units 120. N is an integer greater than or equal to 1.

Figure 8:
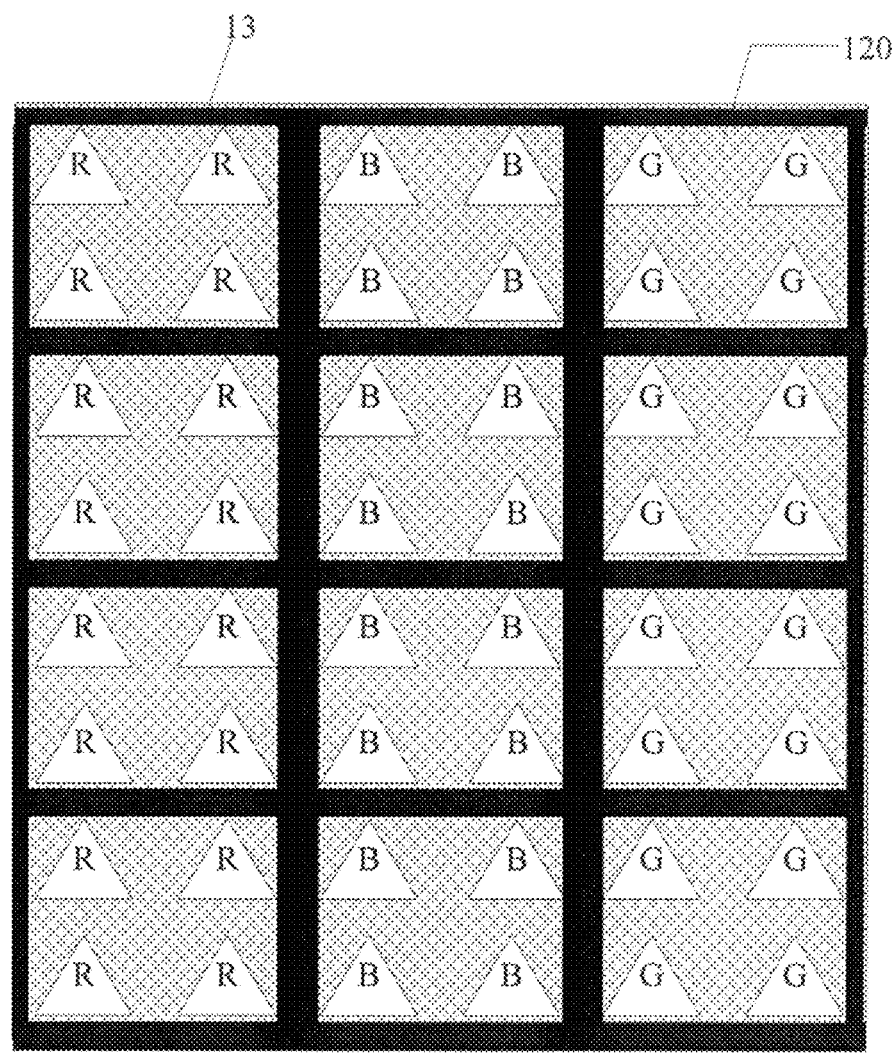
FIG. 8 is a schematic diagram of a display component in a first display mode according to one embodiment of the present disclosure.
Figure 9:
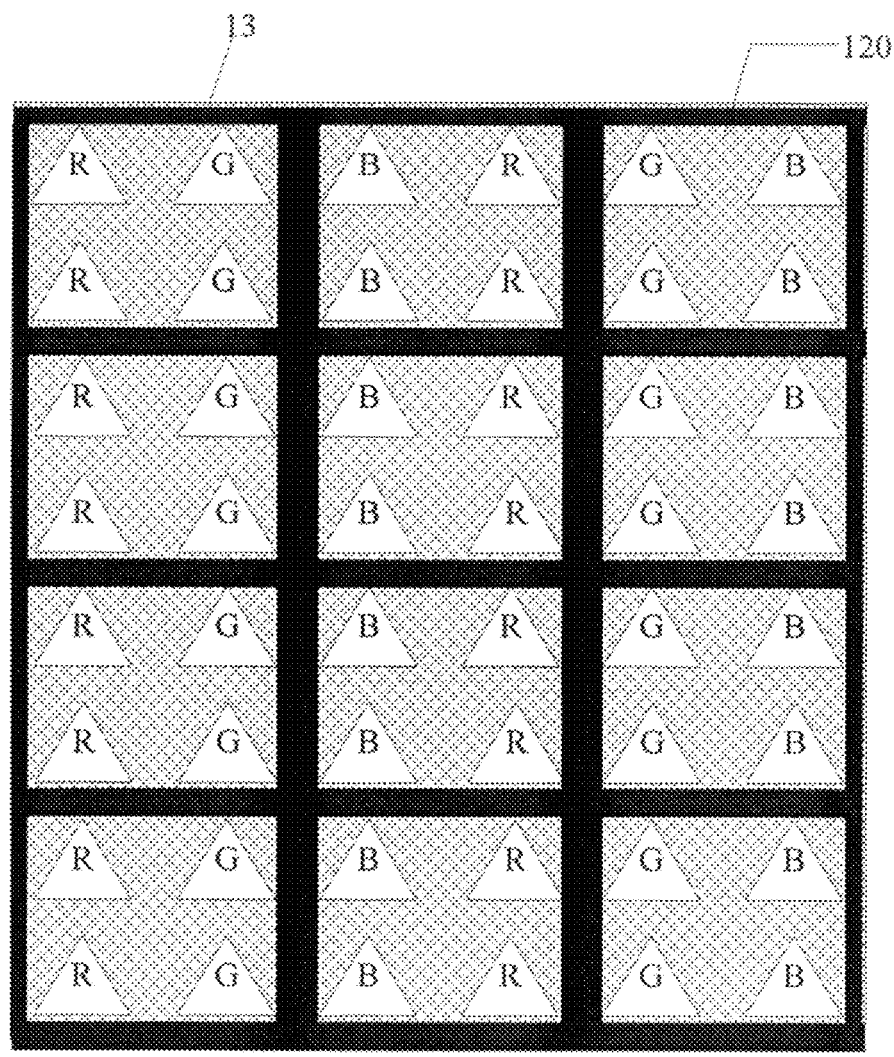
FIG. 9 is a schematic diagram of a display component in a second display mode according to one embodiment of the present disclosure.

FIG. 8 is a schematic diagram of a display component in a first display mode according to one embodiment of the present disclosure. FIG. 9 is a schematic diagram of a display component in a second display mode according to one embodiment of the present disclosure.

In one embodiment, in order to prevent color mixing, in the display component provided by one embodiment of the present disclosure, as shown in FIG. 8, in the first display mode, the light-emitting pixels 12 of one pixel unit 120 serve as one sub-pixel of the display component, such as a red sub-pixel, a green sub-pixel or a blue sub-pixel. Adjacent sub-pixels are separated by a black matrix 13. As shown in FIG. 9, in the second display mode, a column of the light-emitting pixels 12 in one pixel unit 120 functions as one sub-pixel, such as a red sub-pixel, a green sub-pixel or a blue sub-pixel. From one of the dual viewing angles, the adjacent sub-pixels are separated by the black matrix 13. Therefore, with a fixed panel size, the greater the number of pixel units 120 in the display component, the higher the resolution of the display component. Furthermore, in order to improve the resolution of the display component, the smaller the number of light-emitting pixels included in a pixel unit 120, the higher the resolution of the display component.

In one embodiment, in the display component provided by one embodiment of the present disclosure, N is smaller than or equal to 5.

In the display component provided by one embodiment of the present disclosure, the first metal is gold and the second metal is silver. Since the LSPR properties of the metal nanoparticles are closely related to their elemental compositions, the gold-silver composite metal nanoparticles are used as the light-emitting materials in one embodiment of the present disclosure. When the content of gold in the composite metal nanoparticles gradually increases, the extinction spectrum thereof gradually moves toward longer wavelengths and can be utilized in the light-emitting component.

In one embodiment, in the display component provided by one embodiment of the present disclosure, the second electrode layer is a gel electrode containing an ion of a second metal to facilitate efficient electrochemical reaction between the first metal and the second metal. Furthermore, when the second metal is silver, the light emitting performance of the light emitting component can be improved.

In one embodiment, in the display component provided by one embodiment of the present disclosure, as shown in FIG. 1, FIG. 3, and FIG. 6, the second electrode layers 03 are arranged in a matrix. All the first electrode layers 01 are connected into a unitary structure, that is, the first electrode layer 01 has a whole layer structure. As such, the patterning process for the first electrode layer can be omitted, and wirings for providing signals to the first electrode layer can be reduced, thereby reducing cost.

In the display component provided by one embodiment of the present disclosure, the first electrode layers may also be arranged in a matrix. All the second electrode layers are connected into a unitary structure, that is, the second electrode layer has a whole layer structure. As such, the patterning process for the second electrode layer can be omitted, and wirings for providing signals to the second electrode layer can be reduced, thereby reducing cost.

In one embodiment, the first electrode layers may also be arranged in a matrix, and the second electrode layers may be arranged in a matrix, which is not limited.

In the display component provided by one embodiment of the present disclosure, as shown in FIG. 1, FIG. 3, and FIG. 6, the convex protrusion of nanoparticles 021 of the first metal on a side away from the first electrode layer 01 is a cone shape, and the tapered peak portion of the cone shape is directed to the second electrode layer 03. This is conducive to uniform light-emitting on both sides of the light-emitting pixel. The convex protrusion of nanoparticles of the first metal could be other shapes such as a truncated cone.

In the display component provided by one embodiment of the present disclosure, as shown in FIG. 1, FIG. 3, and FIG. 6, the viewing angle control section 21 includes an insulating layer 211 covering the display module 01, a third electrode layer 212 and a fourth electrode layer 213 in this order on the insulating layer 211, and a blocking portion 214 located between the third electrode layer 212 and the fourth electrode layer 213. An accommodating chamber is formed between the adjacent blocking portions 214, and a black non-polar liquid 215 is accommodated in the accommodating chamber.

In one embodiment, when an electric field is applied between the third electrode layer 212 and the fourth electrode layer 213, the black non-polar liquid 215 covers the accommodating chamber. Through the spread black nonpolar liquid 215, the viewing angle control section 21 blocks light from the corresponding column of the light emitting pixels 12 exiting on a side from the peak of the protrusion of the nanoparticle 021 of the first metal away from the other column of the light emitting pixels 12 in the same pixel group S. As such, the second display mode is realized.

In another embodiment, when there is no electric field between the third electrode layer 212 and the fourth electrode layer 213, the black nonpolar liquid 215 collects in a region where the accommodating chamber and the black matrix overlap. As such, the viewing angle control section 21 transmits the light emitted by the corresponding column of the light-emitting pixels 12 to realize the first display mode.

In the display component provided by one embodiment of the present disclosure, the blocking portion 214 is a transparent insulating material.

In the display component provided by one embodiment of the present disclosure, an accommodating chamber between the blocking portions corresponds to a light-emitting pixel. As such, it is easy to control action of the black non-polar liquid in the accommodating chamber, thereby improving control accuracy of the viewing angle control section.

In the display component provided by one embodiment of the present disclosure, as shown in FIG. 1, FIG. 3, and FIG. 6, all the third electrode layers 212 are connected into a unitary structure. That is, the third electrode layer 212 has a whole layer structure. As such, the patterning process for the third electrode layer 212 can be omitted, and wirings for providing signals to the third electrode layer 212 can be reduced, thereby reducing cost.

In the display component provided by one embodiment of the present disclosure, as shown in FIG. 1, FIG. 3, and FIG. 6, all the fourth electrode layers 213 are connected into a unitary structure. That is, the fourth electrode layer 213 has a whole layer structure. As such, the patterning process for the fourth electrode layer 213 can be omitted, and wirings for providing signals to the fourth electrode layer 213 can be reduced, thereby reducing cost.

In the display component provided by one embodiment of the present disclosure, the third electrode layer 212 and the fourth electrode layer 213 may also be intermittent electrode structures, which are not specifically limited herein.

In the display component provided by one embodiment of the present disclosure, as shown in FIG. 1, FIG. 3, and FIG. 6, a package protection layer 22 is provided at a side of the viewing angle switch module 20 away from the display module 10 so as to protect the view angle switch module 20 and the display module 10.

Another example of the present disclosure is a display apparatus comprising the display component according to one embodiment of the present application. The display apparatus may be a mobile phone, a tablet, a television, a monitor, a notebook, a digital photo frame, a navigator, or any product or component that has a display function. For the implementation of the display apparatus, reference may be made to the foregoing embodiment of the display components, and details are not described herein again.

Without being held to a particular theory, it is believed that, in the display component and the display apparatus provided by some embodiments of the present disclosure, when electricity is applied between the first electrode layer, the nanoparticle layer and the second electrode layer, the ions of the second metal are reduced to the second metal, the second metal is then deposited onto the surface of the first metal nanoparticles to form composite metal nanoparticles. In another embodiment, the second metal on the surface of the nanoparticle of the first metal is oxidized to the second metal ion and the second metal ion is formed on the second electrode layer. That is, the elemental composition of the composite metal nanoparticles is controlled by electrodeposition (second metal reduction) and electroerosion (the second metal oxidation) to adjust the LSPR properties of the composite metal nanoparticles so as to continuously adjust the absorption and scattering of the visible light by the composite metal nanoparticles to realize a color display with fast response, no polarization, and no color film. Furthermore, since the first metal nanoparticles are at nanoscale, their particle size is so small, and accordingly ultra-high resolution display can be achieved. Furthermore, because the nanoparticles of the first metal in the display module have convex protrusion on the side away from the first electrode layer, the light can be emitted from different angles. By adjusting the blocking state of the viewing angle control section in the viewing angle switch module, a dual view display mode as well as a traditional display mode can be realized.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A display component, comprising:
a display module; and
a viewing angle switch module at a light-exiting side of the display module,
wherein the display module comprises a plurality of columns of light-emitting pixels on a base substrate each of the light-emitting pixels comprising a first electrode layer, a nanoparticle layer, and a second electrode layer, the nanoparticle layer comprising nanoparticles of a first metal, each of the nanoparticles of the first metal having a convex protrusion on a side away from the first electrode layer, and the second electrode layer comprising a nanoparticle of a second metal;
the viewing angle switch module comprises a plurality of viewing angle control units, each of the plurality of viewing angle control units comprising two viewing angle control sections extending in a column direction, and each of the viewing angle control sections corresponds to a column of the light-emitting pixels; and
each of the viewing angle control sections comprises an insulating layer covering the display module, a third electrode layer, a fourth electrode layer, and a blocking portion between the third electrode layer and the fourth electrode layer, and wherein an accommodating chamber is formed between adjacent blocking portions, and a black non-polar liquid is accommodated in the accommodating chamber.

2. The display component of claim 1, wherein the first metal is gold.

3. The display component of claim 1, wherein the second metal is silver.

4. The display component of claim 1, wherein the convex protrusion of nanoparticles of the first metal is a cone shape or a truncated cone shape.

5. The display component of claim 1, wherein every two adjacent columns of the light-emitting pixels constitute a pixel unit, and the display module further comprises a black matrix between adjacent pixel units.

6. The display component of claim 1, wherein each of the columns of the light-emitting pixels has N rows, and N is an integer greater than of equal to 1.

7. The display component of claim 6, wherein N is an integer less than or equal to 5.

8. The display component of claim 1, wherein the accommodating chamber corresponds to one column of the light-emitting pixels.

9. The display component of claim 1, Wherein the black non-polar liquid is configured to cover the accommodating chamber in a presence of an electric field between the third electrode layer and the fourth electrode layer and collect in a region where the accommodating chamber and the black matrix overlap in an absence of an electric field between the third electrode layer and the fourth electrode layer.

10. The display component of claim 1, wherein the nanoparticle layer further comprises a partition wall configured to separate the adjacent nanoparticles of the first metal, and the partition wall comprises an insulating material.

11. The display component of claim 10, wherein the insulating material silicon dioxide.

12. The display component of claim 1, wherein the first electrode layer of each of the light-emitting pixels is connected to one another to form a unitary structure or the second electrode layer of each of the light-emitting pixels is connected to one another to form a unitary structure.

13. The display component of claim 1, wherein the third electrode layer of each of the plurality of viewing angle control sections is connected one another to form a unitary structure or the fourth electrode layer of each of the viewing angle control sections is connected one another to form a unitary structure.

14. The display component of claim 1, wherein each of the viewing angle control sections is configured to transmit light emitted by the corresponding column of the light-emitting pixels in a first display mode, and to block the light emitted by the corresponding column of the light emitting pixels and exiting on a side from a peak of the convex protrusion of nanoparticles of the first metal away from the other column of the light emitting pixels in the same pixel unit in a second display mode.

15. A display apparatus comprising the display component according to claim 1.

* * * * *